(12) United States Patent  
Oveis Gharan et al.

(10) Patent No.: US 9,088,387 B2
(45) Date of Patent: Jul. 21, 2015

(54) CHAIN ENCODING AND DECODING OF HIGH SPEED SIGNALS

(71) Applicants: Shahab Oveis Gharan, Ottawa (CA); Kim B. Roberts, Ottawa (JP)

(72) Inventors: Shahab Oveis Gharan, Ottawa (CA); Kim B. Roberts, Ottawa (JP)

(73) Assignee: CIENA CORPORATION, Hanover, MD (US)

( * ) Notice: Subject to any disclaimer, the term of this patent is extended or adjusted under 35 U.S.C. 154(b) by 0 days.

(21) Appl. No.: 13/949,627

(22) Filed: Jul. 24, 2013

(65) Prior Publication Data

US 2015/0033092 A1  Jan. 29, 2015

(51) Int. Cl.
*H04L 27/06* (2006.01)
*H04L 1/00* (2006.01)
*H03M 13/25* (2006.01)
*H03M 13/15* (2006.01)

(52) U.S. Cl.
CPC ............... *H04L 1/00* (2013.01); *H03M 13/251* (2013.01); *H03M 13/1515* (2013.01)

(58) Field of Classification Search
CPC ........................... H04L 1/0054; H03M 13/41
USPC ............. 375/341, 340; 341/51; 455/259, 265, 455/298
See application file for complete search history.

(56) References Cited

U.S. PATENT DOCUMENTS

| 7,606,498 | B1 | 10/2009 | Wu et al. |
| 7,894,724 | B2 | 2/2011 | Bontu et al. |
| 8,213,446 | B2 | 7/2012 | Meagher et al. |
| 8,230,294 | B2 | 7/2012 | Roberts et al. |
| 2007/0171102 | A1* | 7/2007 | Strong et al. ................. 341/51 |
| 2011/0299628 | A1* | 12/2011 | Ko et al. ....................... 375/298 |

OTHER PUBLICATIONS

Nonlinear Polarization Crosstalk Canceller for Dual-Polarization Digital Coherent Receivers, Li et al, OSA / OFC/ NFOEC 2010.
Multilevel Codes:Theoretical Concepts and Practical Design Rules, Wachsmann et al, IEEE Transactions on Information Theory, vol. 45, No. 5, Jul. 1999. pp. 1361-1391.
International Search Report and Written Opinion issued on Applicant's corresponding International PCT Application PCT/CA2014/050699, mailed on Sep. 3, 2014. pp. 1-9.

* cited by examiner

*Primary Examiner* — Khai Tran
(74) *Attorney, Agent, or Firm* — Kent Daniels; Daniels IP Services Ltd.

(57) ABSTRACT

A method of recovering a value of a symbol received through an optical communications system. A multi-bit estimate of the symbol is subdivided into a first part and a second part, each part including at least one respective bit of the estimate. A most likely value of the first part is detected. The most likely value of the first part is processed using a Forward Error Correction (FEC) decoder to generate a corrected first part value, which is used to detect a most likely value of the second part. The most likely value of the second part is then processed by the FEC decoder to generate a corrected second part, which is combined with the corrected first part to recover the value of the symbol.

18 Claims, 9 Drawing Sheets

CHAIN ENCODING AND DECODING OF HIGH SPEED SIGNALS

CROSS-REFERENCE TO RELATED APPLICATIONS

This is the first application filed in respect of the present invention.

FIELD OF THE INVENTION

The present application relates generally to communications systems, and more specifically to chain encoding and decoding of high speed signals.

BACKGROUND

For achieving long distance optical signal transmission, at moderate spectral efficiencies, dual polarization Binary Phase Shift Keying (DP-BPSK) and coherent detection are commonly used. As is known in the art, BPSK encodes a single bit value ("0" or "1") onto an optical carrier by modulating the carrier phase between two constellation points that are separated by 180°. DP-BPSK achieves a spectral efficiency of 2-bits per symbol period (baud), by independently modulating single bit values onto each of the orthogonal polarization modes of the optical carrier. This is illustrated in FIG. 1, which shows the BPSK constellation mapped onto the Real (Re)-Imaginary (Im) plane of each of the X- and Y-polarizations.

As is known in the art, other modulation schemes enable increased spectral efficiency by encoding increased numbers of bits per baud. For example, Quadrature Phase Shift Keying (QPSK) enables two bits to be encoded on each polarization, and thus four bits per baud for dual polarization QPSK (DP-QPSK), by using a symmetrical 4-point constellation, as may be seen in FIG. 2. Other modulation schemes, such as Quadrature Amplitude Modulation (QAM) achieve even higher numbers of bits per baud by modulating both the phase and amplitude of the optical field. However, as the number of encoded bits-per-baud increases, the Euclidian distance between neighbouring constellation points decreases. For example, in the BPSK constellations shown in FIG. 1, each constellation point is separated from its neighbour by an angle corresponding to 180° in the Re-Im plane. On the other hand, in the QPSK constellations shown in FIG. 2, each constellation point is separated from its neighbour by an angle corresponding to 90° in the Re-Im plane. The reduced separation between adjacent constellation points results in a corresponding decrease in system margin, which limits the maximum signal reach.

Traditionally, encoding schemes and symbol value assignments have been characterized by the minimum Euclidean distance between pairs of symbols. This yields an asymptotic performance as the Signal-to-Noise Ratio (SNR) increases. However, in high speed optical transmission systems, optical modems need to operate at very low SNRs, for example causing symbol error rates of up to 3%. At these high noise levels, the number of adjacent symbols and the mean number of bit errors per symbol error are very important. Having two symbols at the minimum Euclidean distance from a given symbol doubles the symbol error rate. Having two bit errors for each symbol error makes the bit error rate twice the symbol error rate. Soft forward error correction is commonly used to correct bit errors.

For example, consider the case of a natural coded 4-Pulse Amplitude Modulation (4-PAM) code with symbol values of: 00, 01, 10, 11

The inner two symbols, 01 and 10, each have two neighbours, while the outer symbols only have one. Consequently, an error between the neighbouring symbols 01 and 10 would cause two bit errors. It is possible to use Grey coding to avoid this, but this is an illustration chosen for its simplicity. In more complicated encoding formats Grey coding may not be possible.

At high bit rates, such as hundreds of Gigabits per second, soft forward error correction is implemented in custom CMOS ASICs. [U.S. Pat. No. 8,230,294] A good FEC hardware design minimizes the proportion of overhead used in order to obtain a desired noise tolerance, or maximizes the noise tolerance with a given proportion of overhead. For example, a fixed overhead of 20% or of 40% of the data bits can be added in order to carry the redundancy required to implement soft FEC.

Symbol error correction codes, such as Reed-Solomon, avoid the error multiplication issue by correcting erroneous symbols rather than erroneous bits. While some soft symbol error correction codes are known, to date they have not proven to be practical for high speed implementation and an ASIC. Hardware implementations of symbol error correction tend to be limited to only the specific type of modulation that creates the appropriate symbols.

Traditionally, Grey coding has been used with orthogonal codes per dimension, such as 16-QAM. Where possible, the use of Grey coding means that there is only one bit error for the highly more probable symbol errors. However, Grey coding is not possible on many interesting codes, and Grey coding does not mitigate the issue of the number of adjacent symbols having close to the minimum Euclidean distance.

To partially mitigate the error multiplication issue, multi-dimensional constellations of the type known, for example, from co-pending U.S. patent application Ser. No. 13/655,497, filed Oct. 19, 2012, may reduce the minimum Euclidean distance of some pairs of symbols having a lower Hamming distance, in order to increase the Euclidean distance between pairs of symbols having greater Hamming distance.

Sequential decoding, such as with multilevel codes or partition codes known in the art, can avoid issues of multiple adjacent symbols and the mean number of bit errors per symbol error. In such systems, some of the bits of the symbol are detected in a first pass (first-detected bits). These first-detected bits are then made error free by the use of a FEC code that is optimized for the error rate experienced by those bits in the particular modulation scheme used in the optical communications system. Some more of the bits of the symbol are detected in a second pass (second-detected bits), which may use knowledge of the error-free first detected bits. The second-detected bits are then made error free by the use of a FEC code that is optimized for the error rate experienced by those bits in the particular modulation scheme. The error rate of the second-detected bits (prior to FEC) is commonly significantly lower than that of the first detected bits, so a lower proportion of overhead may be used in the FEC applied to the second-detected bits. This process can be continued for a third and a fourth pass as desired. Sequential decoding can achieve very good performance on the modulation format for which it is optimized. However, known high speed hardware implementations of this method will only function with the particular modulation format for which it was designed. Such solutions are therefore not suitable for communications systems in which either or both of the modulation format and the encoding of symbol values may change.

Carrier recovery cycle slips are another mechanism that triggers the start of a stream of high error rate bits (50% or 100% error) until detected and corrected such as by framing. U.S. Pat. No. 8,166,365 teaches a technique for detecting and correcting cycle slips using known or partly known symbols.

Soft In Soft Out (SISO) turbo decoding is known, where an input sample is equalized, a soft value is decoded from a sample (or sequence of samples) with a confidence metric such as log-likelihood, the SISO improves the confidence in the soft value which is used to improve the equalization to get an improved soft value. This cycle is iterated until the desired confidence is achieved.

Partition decoding is known, where two different bits of a symbol are decoded with different expected confidence levels and sent to different FEC algorithms. The distinct FEC algorithms have been adapted to use the different levels of redundancy required to tolerate the different confidence levels.

Nonlinear Polarization Crosstalk Canceller for Dual-Polarization Digital Coherent Receivers, Li et al, OSA/OFC/NFOEC 2010 describes a method for mitigation of the degradation due to cross-polarization modulation. Unfortunately, this method provides no improvement at high noise levels, and indeed degrades the signal.

What is desired is a technique that enables improved high speed decoding in the presence of large amounts of noise.

SUMMARY

An aspect of the present invention provides a method of recovering a value of a symbol received through an optical communications system. A multi-bit estimate of the symbol is subdivided into a first part and a second part, each part including at least one respective bit of the estimate. A most likely value of the first part is detected. The most likely value of the first part is processed using a Forward Error Correction (FEC) decoder to generate a corrected first part value, which is used to detect a most likely value of the second part. The most likely value of the second part is then processed by the FEC decoder to generate a corrected second part, which is combined with the corrected first part to recover the value of the symbol.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION

Figure 1:
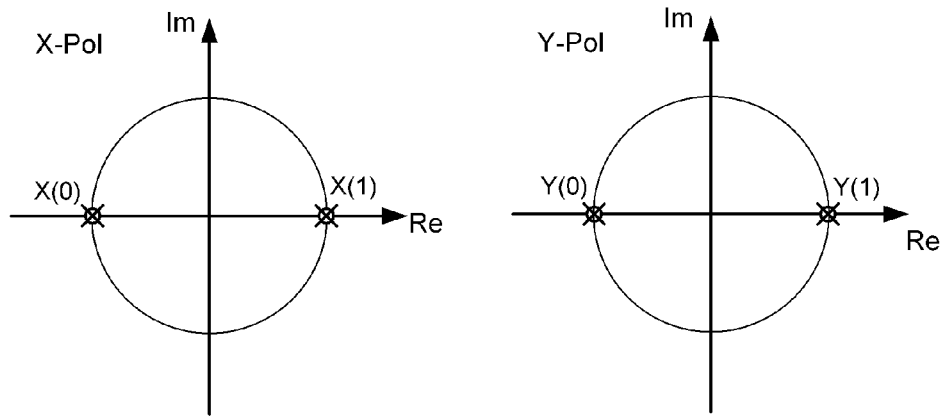
FIG. 1 illustrates a DP-BPSK signal constellation in the Real (Re)/Imaginary (Im) plane.
Figure 2:
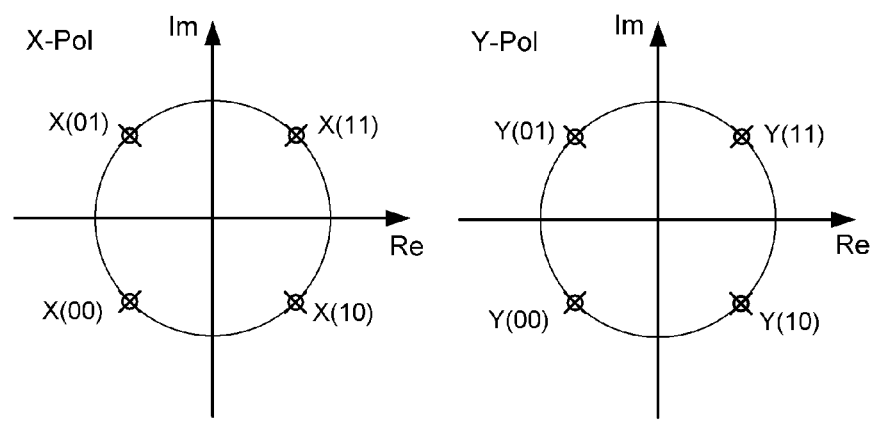
FIG. 2 illustrates a DP-QPSK signal constellation.
Figure 3:
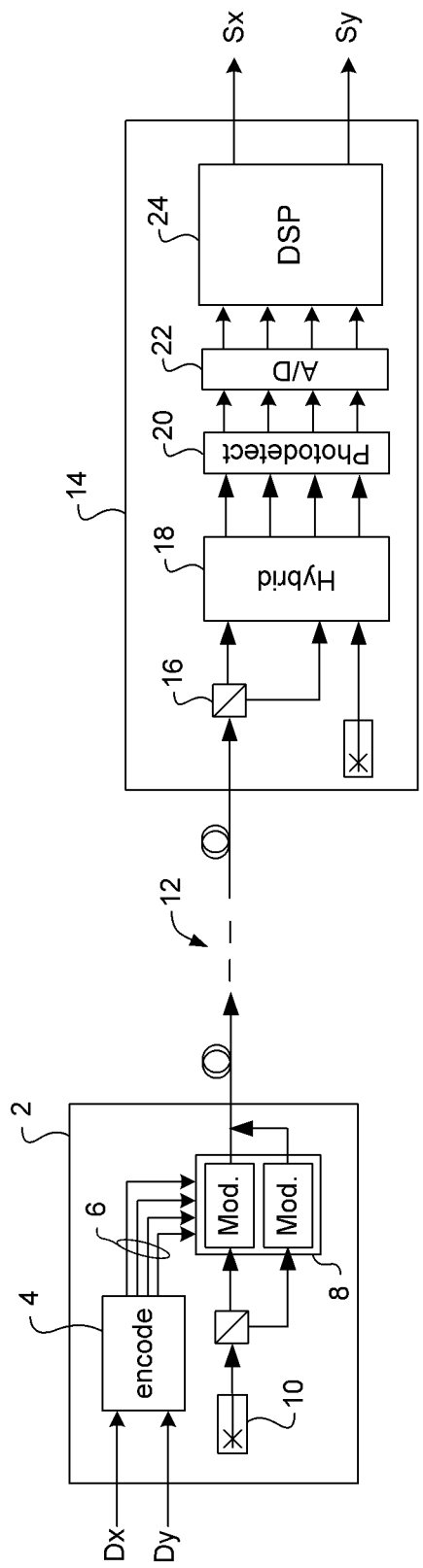
FIG. 3 is a block diagram illustrating elements of an optical communications system.

FIG. 3 illustrates a representative optical communication system in which techniques in accordance with the present disclosure may be implemented. In the optical communication system of FIG. 3, a transmitter 2 generally comprises an encoder 4 for encoding a pair of data signals (Dx and Dy) to generate a set of drive signals 6. The drive signals are then supplied to a modulator 8 for modulating respective dimensions of a continuous wave (CW) optical carrier in accordance with the drive signals. In the example of FIG. 3, a pair of data signals (Dx and Dy) may be encoded as symbols of a given modulation scheme, and the symbols processed to generate four parallel drive signals 6, which are then used to modulate two dimensions (e.g. phase and amplitude, or I and Q) of each orthogonal polarization of the CW optical carrier. The CW optical carrier is typically generated by a laser 10 in a manner known in the art, and the modulator may be implemented using any of a variety of known modulator devices, such as phase modulators, variable optical attenuators, Mach-Zehnder interferometers etc. The modulated optical signal appearing at the output of the modulator is transmitted through an optical fiber link 12 to a coherent receiver 14.

A receiver 14 configured to receive and detect the transmitted data signals may be provided as a coherent receiver, which includes a polarization beam splitter 16 for splitting the received optical signal into received X and Y polarizations, an optical hybrid 18 for separately mixing the X and Y polarizations with a local oscillator, and a set of photodetectors 20 for detecting the optical power of each of the mixing products generated by the optical hybrid 18. An Analog to Digital (A/D) converter block 22 samples each photodetector current, and the resulting sample streams—each of which represents one of the modulated dimensions of the optical carrier field—are processed by a Digital Signal Processor (DSP) 24 in accordance with the M-dimensional constellation to generate recovered signals Sx and Sy that correspond with the transmitted data signals Dx and Dy.

Figure 4:
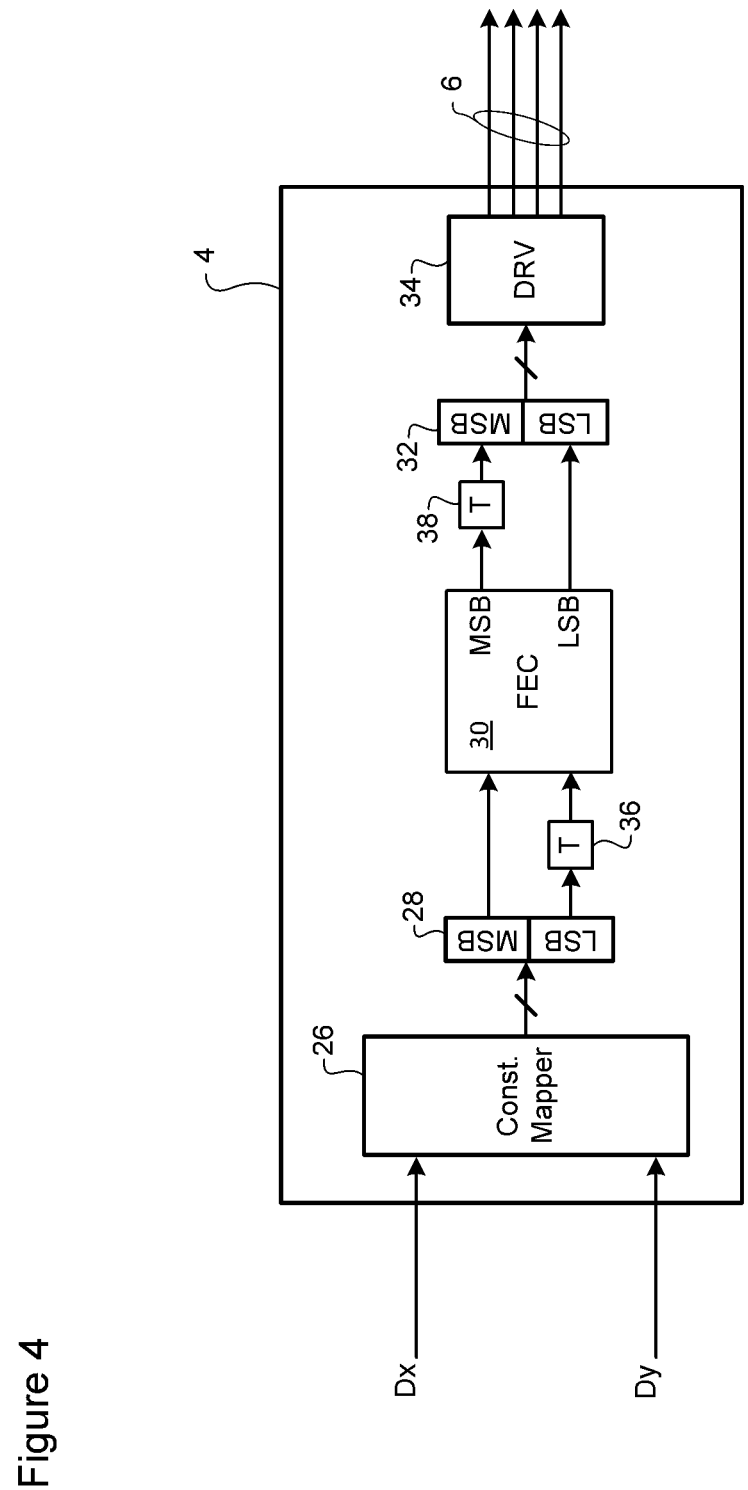
FIG. 4 is a block diagram illustrating elements of an encoder in accordance with a first representative embodiment of the present invention.

FIG. 4 schematically illustrates representative operations of the encoder 4 in greater detail. In the embodiment of FIG. 4, the encoder 4 comprises a constellation mapper 26 for encoding input data streams Dx and Dy as symbols of the modulation scheme implemented by the transmitter 2; a deserializer 28, for separating each successive symbol into respective Most Significant Bit (MSB) and Least Significant Bit (LSB) parts, a FEC encoder 30 for encoding the symbol stream in accordance with the appropriate FEC encoding scheme, an accumulator 32 for accumulating the corrected symbol values, and a driver 34 for converting the FEC encoded symbols into drive signals for driving the modulators 8 to modulate the CW optical carrier. First and Second delay blocks 36 and 38, respectively, each impose a 1 cycle delay for timing control as will be described in greater detail below. Notice that some portion of the MSB and/or LSB of the symbol might be generated by the FEC encoder (corresponding to parity/redundant bits generated by the FEC encoder).

In operation, the deserializer 28 divides each symbol from the constellation mapper 26 into its respective MSB and LSB parts, which may be denoted as MSB(t) and LSB(t). Each of the MSB and LSB parts may contain one or more bits of the symbol. The MSB(t) part is passed directly to the FEC encoder 30. The LSB(t) part from the deserializer 26 is passed to the first delay block 36, which delays the LSB(t) by one cycle. Accordingly, the first delay block 36 passes the LSB part of the previous symbol estimate (denoted as LSB(t−1)) to the FEC encoder 30.

The FEC encoder 30 operates by first assembling a FEC frame comprising the MSB(t) and the LSB(t−1) received from the deserializer 28. The FEC frame is then processed in a known manner to generate an encoded FEC frame. The encoded FEC frame is then disassembled to extract the encoded MSB(t) and LSB(t−1) parts. The encoded MSB(t) is passed to the second delay block 38, which delays the MSB(t) by one cycle. Accordingly, the second delay block 38 passes the MSB part of the previous symbol estimate (denoted as MSB(t−1)) to the accumulator 32. The encoded LSB(t−1) extracted from the encoded FEC frame can also be supplied to the accumulator 32 and combined with the corresponding MSB(t−1) received from the second delay block 38 to assemble a fully encoded value of the previous symbol.

With this arrangement, FEC encoded symbols are supplied to the driver circuit 34, and used to modulate the CW carrier. However, the MSB and LSB parts of each FEC encoded symbol have been encoded in respective different FEC frames.

Figure 5:
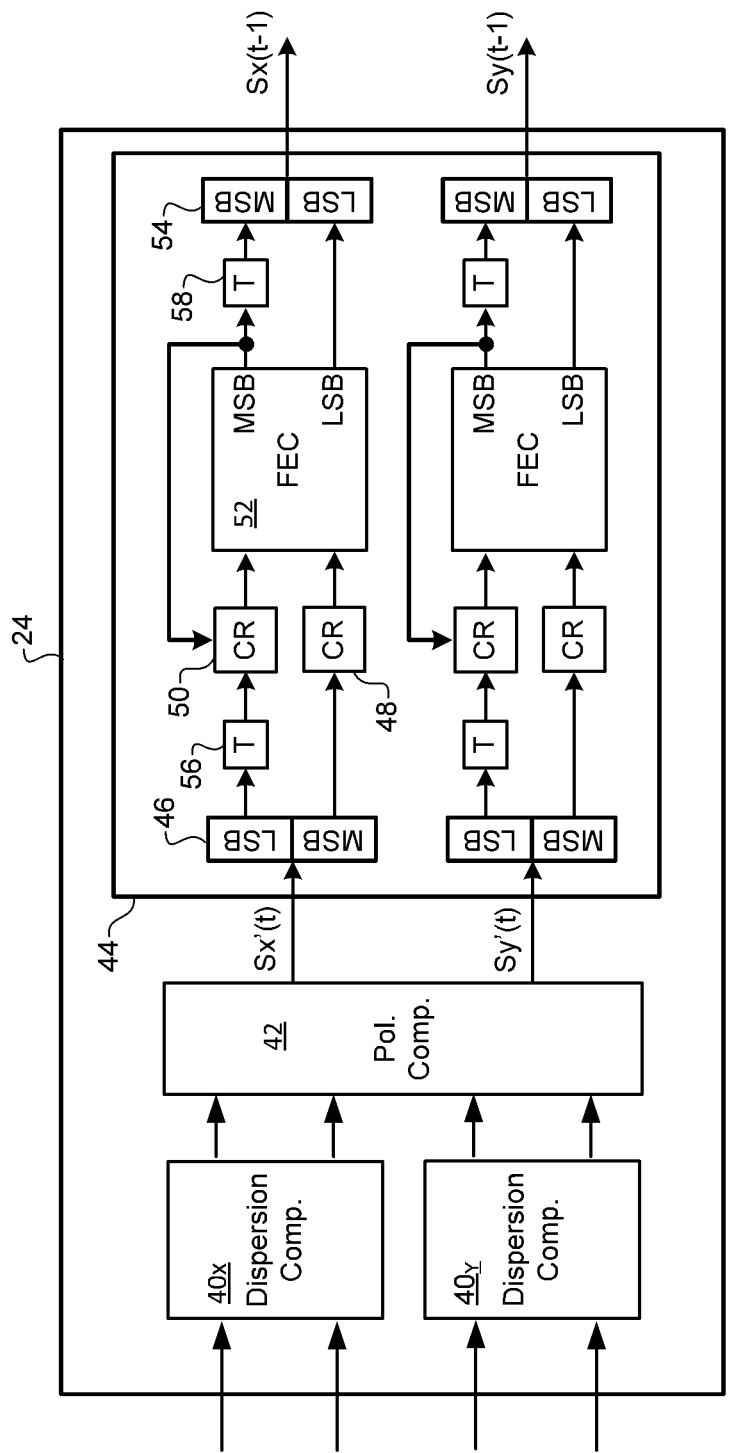
FIG. 5 is a block diagram illustrating elements of a receiver in accordance with a first representative embodiment of the present invention.

FIG. 5 schematically illustrates representative operations of the DSP 24 in greater detail. As may be seen in FIG. 5, from the A/D converter 22 block, the respective sample streams of each received polarization are supplied to a corresponding dispersion compensator 40, which operates on the sample stream(s) to compensate chromatic dispersion. Various methods are known for performing this function, such as, for example Finite Impulse Response (FIR) filters.

The dispersion-compensated sample streams appearing at the output of the dispersion compensators 40 are then supplied to a polarization compensator 42 which operates to compensate polarization effects, and thereby de-convolve transmitted symbols from the complex sample streams output from the dispersion compensators 40. If desired, the polarization compensator 42 may operate as described in Applicant's U.S. Pat. No. 7,555,227 which issued Oct. 30, 2009. Thus, for example, the polarization compensator 42 may be configured as a Finite Impulse Response (FIR) filter which implements an Inverse Jones matrix.

The polarization compensator 42 outputs are then supplied to a detector block 44, which performs carrier recovery, phase error correction, and symbol detection.

U.S. Pat. No. 7,606,498, which issued Oct. 20, 2009 teaches a known symbol detection technique in which a phase rotation κ(n) is applied to a multi-bit symbol estimate S'(t) and the phase-rotated symbol estimate is then processed by a decision circuit to determine the most likely symbol value. The thus determined symbol value is then used to compute a residual phase error Δφ(n) of the rotated symbol estimate, which is used to compute the phase rotation κ(n+1) to be applied to one of more subsequent symbol estimates. The determined symbol value may also be supplied to a Forward Error Correction (FEC) block for symbol error correction.

In the present disclosure, the technique of U.S. Pat. No. 7,606,498 may be modified to implement chain decoding, in which the Most Significant Bit (MSB) and the Least Significant Bit (LSB) parts of each symbol estimate are detected and FEC decoded in respective separate cycles. In some embodiments, the MSB part MSB(t) may identify a decision region of the applicable symbol constellation, and subsequent processing the LSB part is used to identify the most likely symbol value within that decision region. Alternatively, the MSB part MSB(t) may identify a predetermined set of candidate symbols, and subsequent processing the LSB part is used to identify the most likely one of the candidate symbol values. In still other embodiments, the value of the LSB part may be related to the value of the MSB part by a predetermined a-prior probability. In this case, the detected value of the MSB part and a Maximum A-Posteriori Probability (MAP) criterion may be used to detect the LSB part.

In the embodiment of FIG. 5, the detector block 44 comprises a deserializer 46, for separating a given symbol estimate S'(t) into respective Most Significant Bit (MSB) and Lease Significant Bit (LSB) parts, Carrier Recovery (CR) blocks 48 and 50, respectively, for detecting the most likely MSB and LSB values, a FEC decoder 52 for correcting errors, and an accumulator 54 for accumulating the detected symbol value. First and Second delay blocks 56 and 58, respectively, each impose a 1 cycle delay for timing control as will be described in greater detail below.

Figure 6:
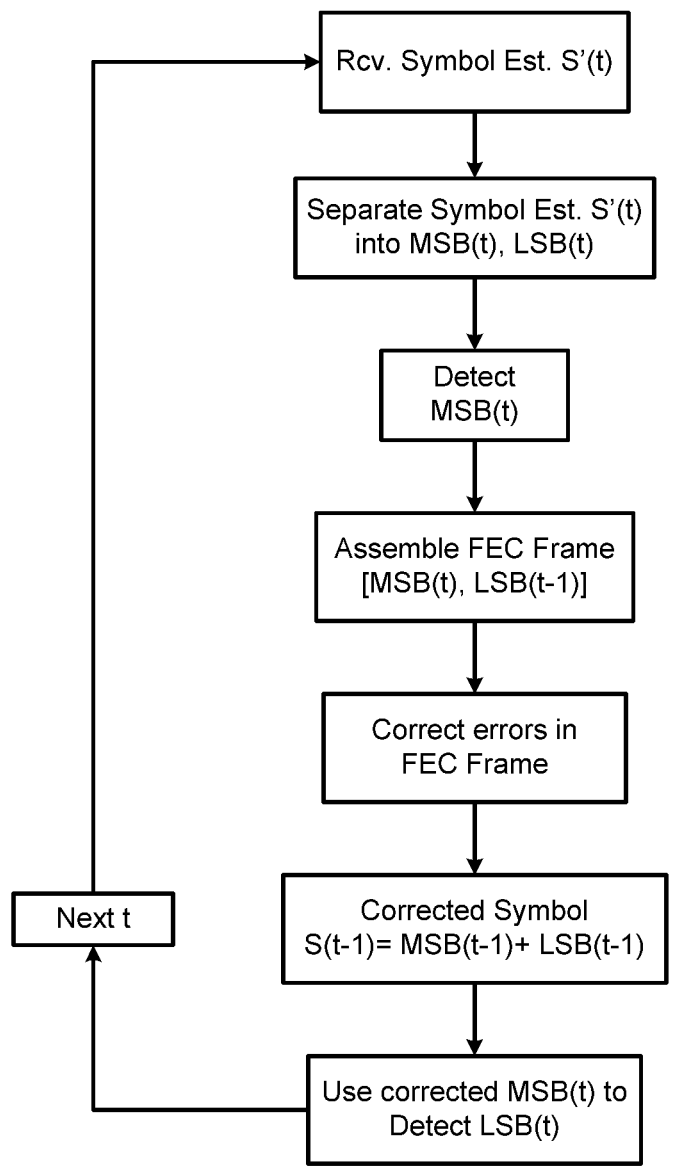
FIG. 6 is a flow-chart illustrating a chain decoding method usable in the embodiment of FIG. 4.

FIG. 6 is a flow-chart schematically illustrating a representative algorithm implemented by the detector block 44 of FIG. 5. As may be seen in FIGS. 5 and 6, upon receipt of a symbol estimate S'(t) from the polarization compensator 42, the deserializer 46 divides the symbol estimate S'(t) into its respective MSB and LSB parts, which may be denoted as MSB(t) and LSB(t). Each of the MSB and LSB parts may contain one or more bits of the symbol estimate S'(t). The MSB(t) part is passed to a respective MSB CR block 48 to determine its most likely value. In some embodiments, the MSB CR block 48 may operate by computing and applying phase rotations, and implementing decision functions of the type known, from U.S. Pat. No. 7,606,498, but in this case, the MSB CR block 48 is operating only on the MSB(t) part of the symbol estimate, rather than the entire symbol estimate S'(t). The detected value of the MSB(t) part is then passed to a FEC block 52 for error correction.

The LSB(t) part from the deserializer 46 is passed to a first delay block 56, which delays the LSB(t) by one cycle. Accordingly, the first delay block 56 passes the LSB part of the previous symbol estimate (denoted as LSB(t−1)) to a respective LSB CR block 50 to determine its most likely value. In some embodiments, the LSB CR block 50 may operate by computing and applying phase rotations, residual phase errors and decision functions of the type known, from U.S. Pat. No. 7,606,498, but in this case, the LSB CR block 50 is operating only on the LSB part of the previous symbol estimate (LSB(t−1)), and makes use of the knowledge of the previously detected MSB(t−1) part. The detected value of the LSB(t−1) is then passed to the FEC block 52 for error correction.

The FEC block 52 operates by first assembling a FEC frame comprising the MSB(t) and the LSB(t−1) parts received from the CR blocks 48 and 50. The FEC frame is then processed in a known manner to correct all errors in the FEC frame. The corrected FEC frame is then disassembled to extract the corrected MSB(t) and LSB(t−1) parts. The corrected MSB(t) part is passed to the second delay block 58, which delays the MSB(t) part by one cycle. Accordingly, the second delay block 58 passes the MSB part of the previous symbol estimate (denoted as MSB(t−1)) to the accumulator 54. The corrected MSB(t) part is also supplied back to the LSB CR block 50 to facilitate detection of the most likely value of the LSB(t). This is advantageous in that knowledge of the correct value of the MSB part of a given symbol estimate S'(t) can be used to improve the detection of the most likely value of the LSB part of that same symbol estimate S'(t). For example, the corrected MSB(t) from the FEC block 52 may be substantially free of cycle slips. In this case, using the corrected MSB(t) to detect the LSB(t) effectively increases the noise margin for non-linear impairments such as Cross Phase Modulation (XPM) and Cross Polarization Modulation (XPolM). this means that the LSB(t) value output to the FEC block 52 will be substantially free of cycle slips and has reduced nonlinear degradations as compared to prior art systems in which the MSB and LSB parts of each symbol estimate are detected and processed together.

The corrected LSB(t−1) extracted from the corrected FEC frame can also be supplied to the accumulator 40 and combined with the corresponding MSB(t−1) received from the second delay block 44 to assemble a fully corrected value of the previously received symbol estimate S(t−1).

In the technique described above, knowledge of the corrected MSB part of a given symbol estimate S'(t) is used to improve the detection of the corresponding LSB part of that symbol. This can be used to reduce the FEC overhead required to successfully correct errors in the FEC frame composed of the LSB part of one symbol estimate S'(t−1) and the MSB part of a later symbol estimate S'(t). This arrangement enables a single ASIC design to support modulation schemes ranging from those in which there is no difference in error rate between MSB and LSB parts, to those in which there is an extreme difference.

A further benefit of the above technique is that the respective number of bits in the MSB and LSB parts can be equal or different, as desired. In addition, this technique is generally independent of the modulation format of each symbol, and of the number of data bits encoded within each symbol. Thus the number of data bits encoded within each symbol can be adapted to suit the optical channel and client bit-rate.

With power shaping, it is advantageous to adapt the number of data bits encoded in each symbol as a function of the power of that symbol, which is a function of the client bit pattern. At the receiver, a mistake in the number of bits encoded in a symbol will shift the alignment of the subsequent bit pattern in the FEC frame, potentially causing a very large number of bit errors. With chain decoding in accordance with the present invention, once the value of the a first part of the symbol has been corrected to be error free, that corrected value can be used to determine the number of bits to be detected in the second part of the same symbol. It is generally desirable that the first and second parts occupy the same time interval, for implementation simplicity and for strongest correlation of degradations. However, the parts can be staggered in time or other dimension if needed.

Figure 7:
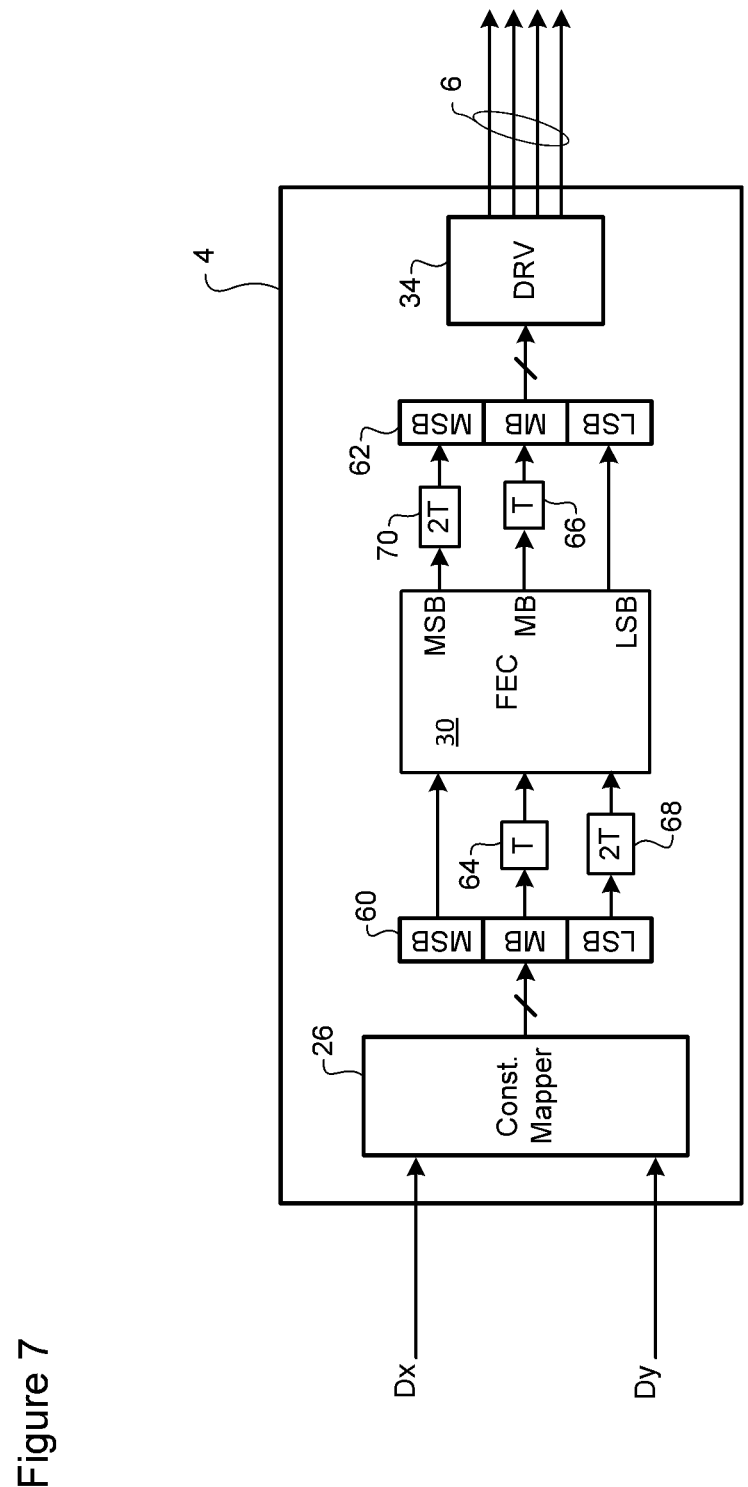
FIG. 7 is a block diagram illustrating elements of an encoder in accordance with a second representative embodiment of the present invention.
Figure 8:
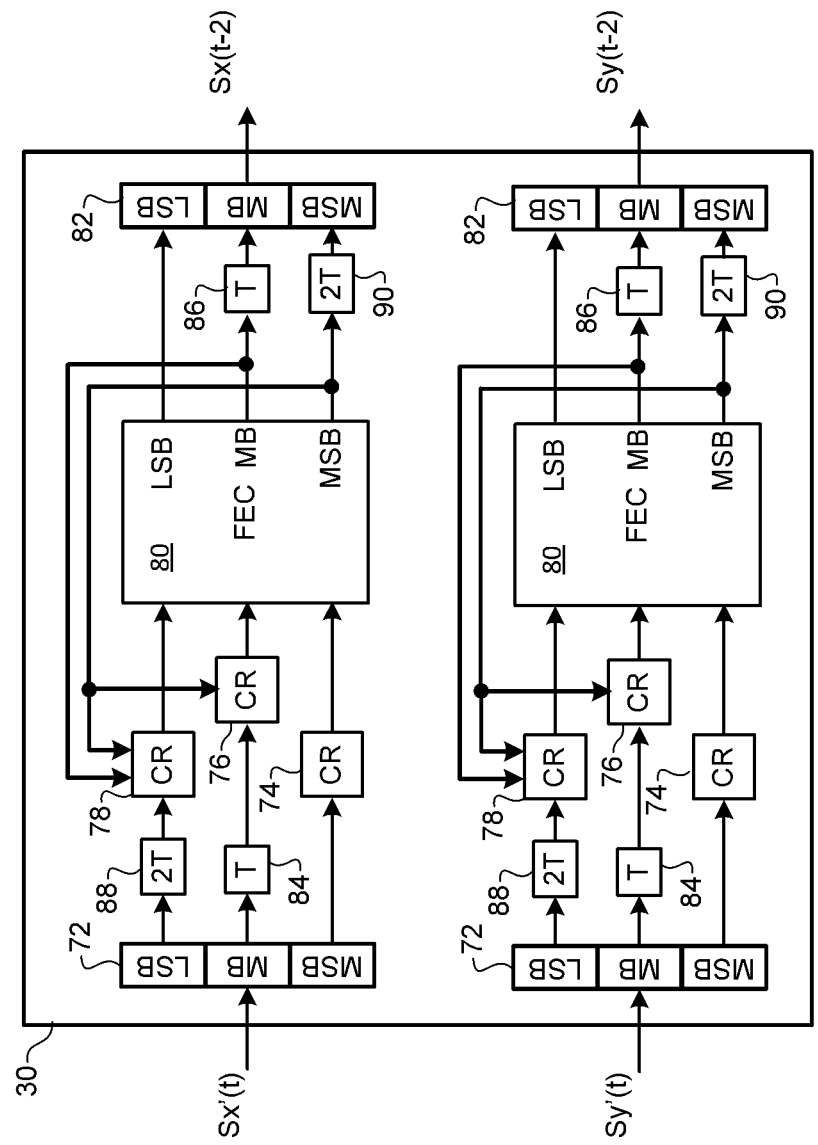
FIG. 8 is a block diagram illustrating elements of a detector block in accordance with a second representative embodiment of the present invention.
Figure 9:
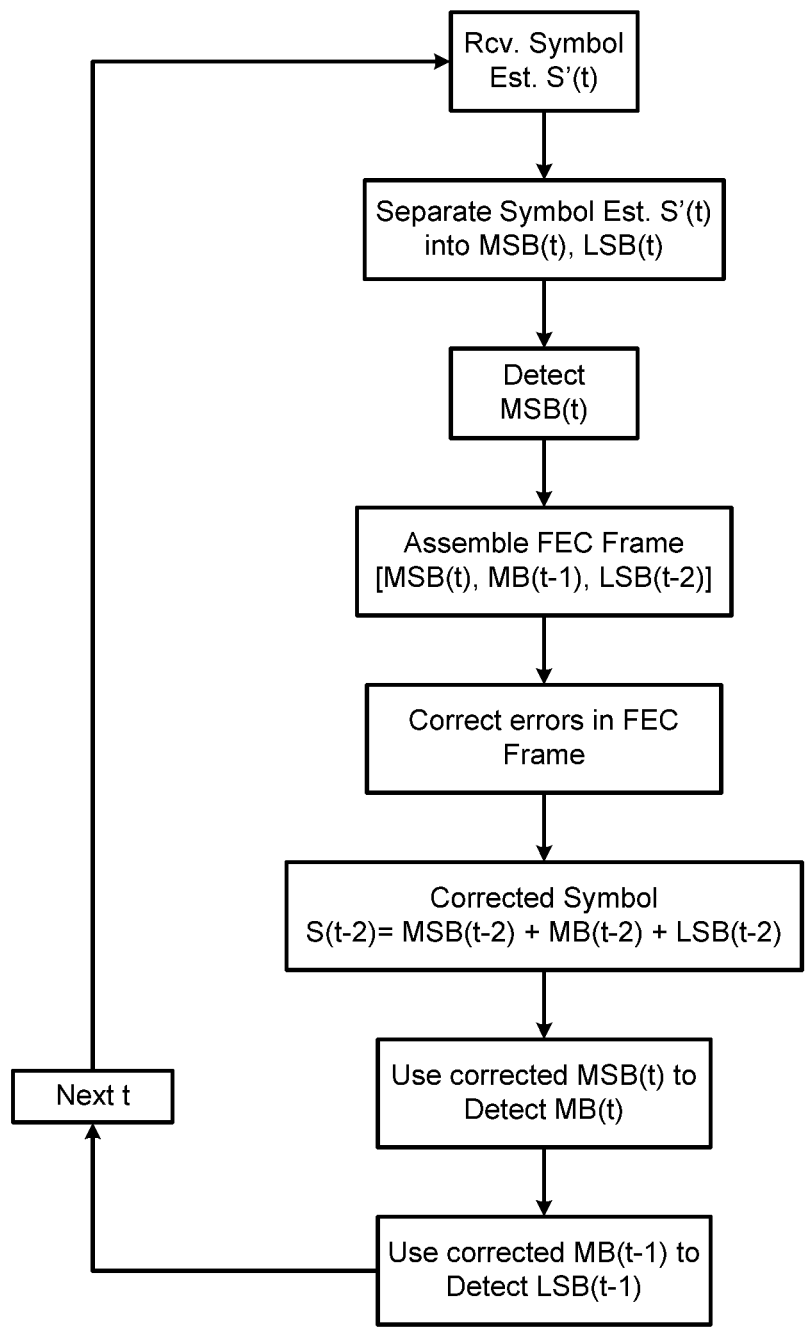
FIG. 9 is a flow-chart illustrating a chain decoding method usable in the embodiment of FIG. 8.

In the embodiment of FIGS. 4-6, each symbol is subdivided into two parts (an MSB part and an LSB part) which are processed in respective different FEC frames. However, it will be appreciated that the present technique can be extended to embodiments in which each symbol is subdivided into any desired number of parts. For example, FIGS. 7-9 illustrate an embodiment in which each symbol subdivided into three parts, comprising an MSB part, a Mid-Bit (MB) part, and an LSB part, each of which comprise at least one respective bit. As in the embodiment described above with reference to FIGS. 4-6, each of the MSB, MB and LSB parts may include the same or a different number of bits, as desired. Accordingly, in the embodiment of FIG. 7, the encoder 4 comprises a constellation mapper 26 for encoding input data streams Dx and Dy as symbols of the modulation scheme implemented by the transmitter 2; a deserializer 60, for separating each successive symbol into respective Most Significant Bit (MSB), Mid bit (MB) and Least Significant Bit (LSB) parts, a FEC encoder 30 for encoding the symbol stream in accordance with the appropriate FEC encoding scheme, an accumulator 62 for accumulating the corrected symbol values, and a driver 34 for converting the FEC encoded symbols into drive signals for driving the modulators 8 to modulate the CW optical carrier. T delay blocks 64 and 66, respectively, each impose a 1 cycle delay, and 2T delay blocks 68 and 70, respectively, each impose a 2 cycle delay for timing control, as will be described in greater detail below.

In operation, the deserializer 60 divides each symbol from the constellation mapper 26 into its respective MSB, MB and LSB parts, which may be denoted as MSB(t), MB(t) and LSB(t). Each of the MSB, MB and LSB parts may contain one or more bits of the symbol. The MSB(t) part is passed directly to the FEC encoder 30. The MB(t) part from the deserializer 26 is passed to a T delay block 64, which delays the MB(t) by one cycle. Accordingly, the T delay block 64 passes the MB part of the previous symbol estimate (denoted as MB(t−1)) to the FEC encoder 30. The LSB(t) part from the deserializer 26 is passed to a 2T delay block 68, which delays the LSB(t) by two cycles. Accordingly, the 2T delay block 68 passes the LSB part of the second previous symbol estimate (denoted as LSB(t−2)) to the FEC encoder 30.

The FEC encoder 30 operates by first assembling a FEC frame comprising the MSB(t), MB(t−1) and the LSB(t−2) parts received from the deserializer 60. The FEC frame is then processed in a known manner to generate an encoded FEC frame. The encoded FEC frame is then disassembled to extract the encoded MSB(t), MB(t−1) and LSB(t−2)) parts. The encoded MSB(t) is passed to a 2T delay block 70, which delays the MSB(t) by two cycles. Accordingly, the 2T delay block 70 passes the MSB part of the second previous symbol (denoted as MSB(t−2))) to the accumulator 62. The encoded MB(t−1) extracted from the encoded FEC frame is passed to a T delay block 66, which delays the MB(t−1) by one cycle. Accordingly, the T delay block 66 passes the MB part of the second previous symbol (denoted as LSB(t−2))) to the accumulator 62. The encoded LSB(t−2)) extracted from the encoded FEC frame can also be supplied to the accumulator 62 and combined with the corresponding MSB(t−2)) received from the 2T delay block 70 and the MB(t−2)) received from the T delay block 66 to assemble a fully encoded value of the second previous symbol.

With this arrangement, FEC encoded symbols are supplied to the driver circuit 34, and used to modulate the CW carrier. However, the MSB, MB and LSB parts of each FEC encoded symbol have been encoded in respective different FEC frames.

Referring to FIG. 8, the detector block 30 comprises a deserializer 72 for separating a given symbol estimate R(t) into respective Most Significant Bit (MSB), Mid Bit (MB) and Least Significant Bit (LSB) parts, Carrier Recovery (CR) blocks 74, 76 and 78 for detecting the most likely MSB, MB and LSB values, a FEC decoder 80 for correcting errors, and an accumulator 82 for accumulating the detected symbol value. T delay blocks 84 and 86, respectively, impose a one cycle delay, while 2T delay blocks 88 and 90, respectively, impose a two cycle delay as will be described in greater detail below.

FIG. 9 is a flow-chart schematically illustrating a representative algorithm implemented by the detector block 30 of FIG. 8. As may be seen in FIGS. 8 and 9, upon receipt of a symbol estimate S'(t) from the polarization compensator 28, the deserializer 72 divides the symbol estimate S'(t) into its respective MSB, MB and LSB parts, which are denoted as MSB(t), MB(t) and LSB(t). Each of the MSB, MB and LSB parts may contain one or more bits of the symbol estimate S(t). The MSB(t) part is passed to a respective MSB CR block 74 to determine its most likely value. In some embodiments, the MSB CR block 74 may operate by computing and applying phase rotations, and implementing decision functions of the type known, from U.S. Pat. No. 7,606,498, but in this case, the MSB CR block 74 is operating only on the MSB part of the symbol estimate, rather than the entire symbol estimate S'(t). The detected value of the MSB(t) is then passed to the FEC block 80 for error correction.

The MB(t) part is passed from the deserializer 72 to a T delay block 84, which delays the MB(t) by one cycle, and so passes the MB part of the previous symbol estimate (denoted as MB(t−1)) to a respective MB CR block 76 to determine its most likely value. In some embodiments, the MB CR block 76 may operate by computing and applying phase rotations, and implementing decision functions of the type known, from U.S. Pat. No. 7,606,498, but in this case, the MB CR block 76 is operating only on the MB part of the symbol estimate, rather than the entire symbol estimate S'(t). The detected value of the MB(t−1) is then passed to the FEC block 80 for error correction.

The LSB(t) part is passed from the deserializer 72 to a 2T delay block 88, which delays the LSB(t) by two cycles, and so passes the LSB part of the second previous symbol estimate (denoted as LSB(t−2))) to a respective LSB CR block 78 to determine its most likely value. In some embodiments, the LSB CR block 78 may operate by computing and applying phase rotations, and implementing decision functions of the type known, from U.S. Pat. No. 7,606,498. The detected value of the LSB(t−2)) is then passed to the FEC block 80 for error correction.

The FEC block 80 operates by first assembling a FEC frame comprising the MSB(t), MB(t−1) and the LSB(t−2)) received from the CR blocks 74, 76 and 78. The FEC frame is then processed in a known manner to correct all errors in the FEC frame. The corrected FEC frame is then disassembled to extract the corrected MSB(t), MB(t−1) and LSB(t−2)) parts. The corrected MSB(t) part is passed to a 2T delay block 90, which delays the MSB(t) part by two cycles. Accordingly, the 2T delay block 90 passes the MSB part of the next previous symbol estimate (denoted as MSB(t−2))) to the accumulator 82. The corrected MSB(t) is also supplied back to the MB and LSB CR blocks 76 and 78 to facilitate detection of the most likely value of the MB(t) and LSB(t) parts. This is advantageous in that knowledge of the correct value of the MSB part of a given symbol estimate S'(t) can be used to improve the detection of the most likely value of the MB and LSB parts of that same symbol estimate S'(t). The corrected MB(t−1) is passed to a T delay block 86, which delays the MB(t−1) by one cycle. Accordingly, the T delay block 86 passes the MB part of the next previous symbol estimate (denoted as MB(t−2))) to the accumulator 82. The corrected MB(t−1) is also supplied back to the LSB CR block 78 to facilitate detection of the most likely value of the LSB(t−1). This is advantageous in that knowledge of the correct value of the MB part of a given symbol estimate S'(t−1) can be used to improve the detection of the most likely value of the LSB part of that same symbol estimate S'(t−1). The corrected LSB(t−2)) extracted from the corrected FEC frame is also supplied to the accumulator 82 and combined with the corresponding MB(t−2)) received from the T delay block 86 and the MSB (t−2)) received from the 2T delay block 90 to assemble a fully corrected value S(t−2)) of the previously received symbol estimate S'(t−2)).

In the embodiments of FIGS. 5 and 8, a deserializer 46, 72 is used to subdivide each symbol estimate S'(t) into two or more parts which are then independently detected and FEC decoded in sequence. However, it will be appreciated that other arrangements may be used to achieve equivalent results.

Figure 10:
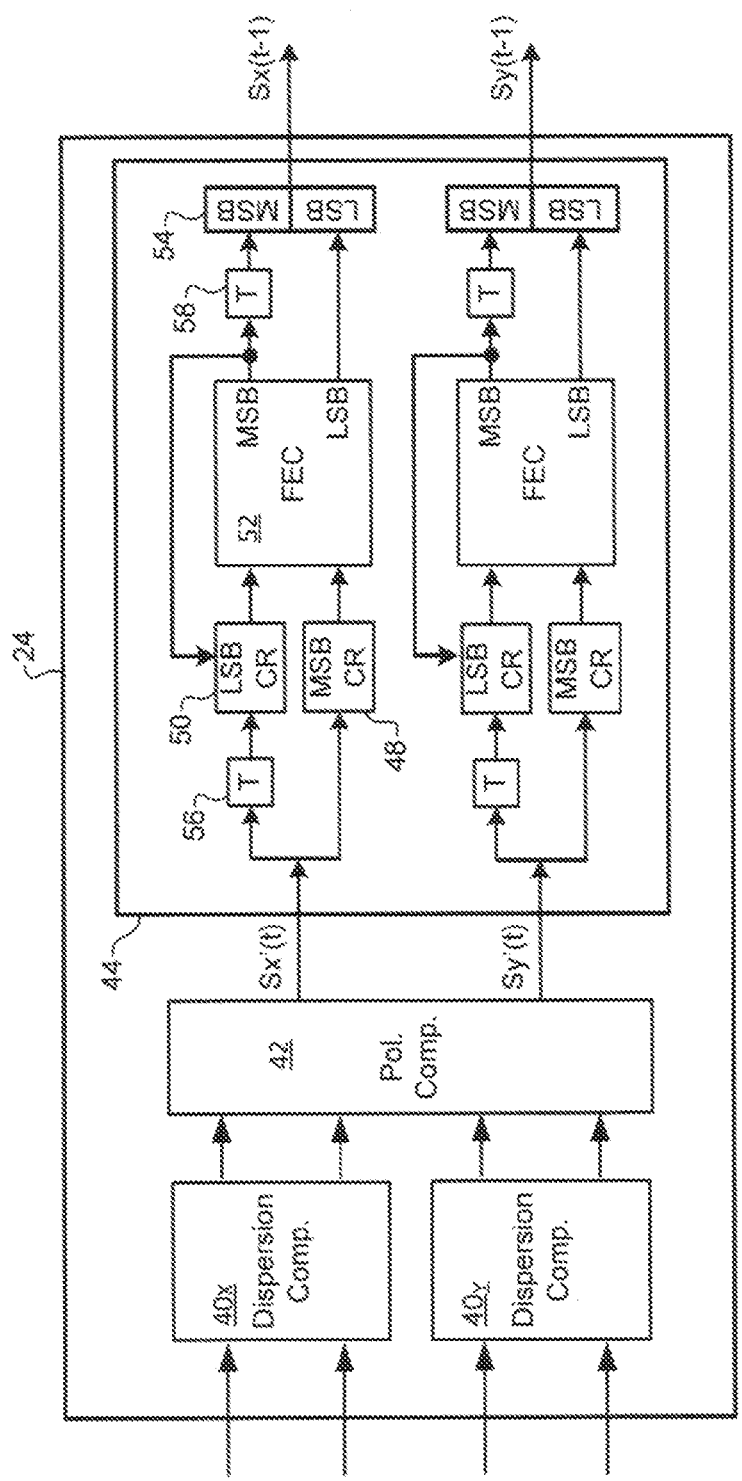
FIG. 10 is a block diagram illustrating elements of a receiver in accordance with a third representative embodiment of the present invention.

For example, FIG. 10 illustrates an embodiment which operates in a manner similar to the embodiment of FIG. 5, but in which the deserializer 46 is omitted. In the embodiment of FIG. 10, the LSB CR block 50 is configured to receive a whole symbol estimate S'(t−1), but operates to detect only the LSB portion of that symbol estimate. Similarly, the MSB CR block 48 is configured to receive a whole symbol estimate S'(t), but operates to detect only the MSB portion of that symbol estimate. With this arrangement, the downstream processing steps (e.g. FEC block 52, T delay 58 and combiner 54) may operate as described above with reference to FIG. 5. However, an advantage of the embodiment of FIG. 10 is that the deserializer 46 can be eliminated at a cost of only a slight increase in complexity of the CR blocks 48 and 50.

As may be appreciated, Soft-In-Soft-Out (SISO) is distinct from a large block Soft In Hard Out FEC where the hard output has a bit error rate of approximately zero ($<<10^{-12}$) in the operating regime. It is generally advantageous that the FEC used in chain decoding be soft in and hard out, with the output bit error rate meeting the system's customer requirement of approximately zero.

A symbol being decoded could consist of one dimension, such as 8-PAM. Usually one symbol is derived from several dimensions such as I,Q (e.g. 16-QAM), and X,Y polarization (DP-QPSK). Odd and even time samples can be grouped as one symbol, with for example, eight dimensions. Symbols might be detected from samples comprising these dimensions, or from values derived from these samples with a possible change in coordinate system.

Effectively error-free knowledge of a subset of the bits of a symbol can be used to reduce the effects of degradations on another subset such as due to: intersymbol interference, partition choices, shell choices, tree choices, nonlinear degradation, polarization effects, phase noise, error multiplication, cycle slip, clock phase error, and frequency offset. The effective elimination of the bit errors in that subset allows stronger compensation or selection decisions to be achieved, without degradation due to error multiplication.

The embodiments of the invention described above are intended to be illustrative only. The scope of the invention is therefore intended to be limited solely by the scope of the appended claims.

We claim:

1. A method of recovering a value of a symbol received through an optical communications system, the method comprising:
   detecting a most likely value of a first part of a multi-bit symbol estimate;
   processing the detected most likely value of the first part by a Forward Error Correction (FEC) decoder to generate a corrected first part value;
   using the corrected first part value to detect a most likely value of a second part of the multi-bit symbol estimate; and
   processing the detected most likely value of the second part by the FEC decoder to generate a corrected second part value;
   wherein the most likely value of the first part is processed by the FEC decoder simultaneously with the most likely value of the respective second part of a previous symbol estimate.

2. The method of claim 1 further comprising an accumulator combining the corrected first and second part values to recover the value of the symbol.

3. The method of claim 1 wherein each of the first part and the second part comprise an equal number of bits of the multi-bit symbol estimate.

4. The method of claim 1 wherein the most likely value of the second part of the multi-bit symbol estimate is detected using a Maximum A-Posteriori Probability (MAP) criterion.

5. The method of claim 1 wherein detecting the most likely value of the second part of the multi-bit symbol estimate comprises:
identifying a set of candidate values of the second part of the symbol estimate, based on the corrected first part value; and
identifying a most likely one of the set of candidate values as the most likely value of the second part of the multi-bit symbol estimate.

6. The method of claim 1 wherein the first part comprises one or more most significant bits (MSBs) of the multi-bit symbol estimate, and wherein the second part comprises either one of:
one or more least significant bits (LSBs) of the multi-bit symbol estimate; and
one or more middle bits (MBs) of the multi-bit symbol estimate.

7. The method of claim 1 wherein the first part comprises one or more middle bits (MBs) of the multi-bit symbol estimate, and wherein the second part comprises one or more least significant bits (LSBs) of the multi-bit symbol estimate.

8. A method of recovering a value of a symbol received through an optical communications system, the method comprising:
detecting a most likely value of a first part of a multi-bit symbol estimate;
processing the detected most likely value of the first part by a Forward Error Correction (FEC) decoder to generate a corrected first part value;
using the corrected first part value to detect a most likely value of a second part of the multi-bit symbol estimate; and
processing the detected most likely value of the second part by the FEC decoder to generate a corrected second part value;
wherein each of the first part and the second part comprise a respective different number of bits of the multi-bit symbol estimate and
wherein the corrected first part value indicates a number of bits encoded in the second part.

9. A method of recovering a value of a symbol received through an optical communications system, the method comprising:
detecting a most likely value of a first part of a multi-bit symbol estimate;
processing the detected most likely value of the first part by a Forward Error Correction (FEC) decoder to generate a corrected first part value;
using the corrected first part value to detect a most likely value of a second part of the multi-bit symbol estimate; and
processing the detected most likely value of the second part by the FEC decoder to generate a corrected second part value;
wherein the symbol is distributed across two or more dimensions of an optical carrier light.

10. The method of claim 9 wherein the two or more dimensions comprise any one or more of:
at least two phases;
at least two polarization directions;
at least two time slots; and
at least two frequencies.

11. A receiver for recovering a value of a symbol transmitted through an optical communications system from a transmitter, the receiver comprising:
a first configured to detect a most likely value of a first part of a multi-bit symbol estimate;
a Forward Error Correction (FEC) decoder for configured to process the detected most likely value of the first part to generate a corrected first part value;
a second detector configured to detect a most likely value of a second part of the multi-bit symbol estimate using the corrected first part value; and
the FEC decoder being further configured to process the most likely value of the second part to generate a corrected second part value;
wherein the FEC decoder is configured to simultaneously process the most likely value of the first part of the symbol and the most likely value of the respective second part of a previous symbol estimate.

12. The receiver of claim 11, further comprising a deserializer configured to subdivide a multi-bit estimate of the symbol into the first part and the second part, each part including at least one respective bit of the symbol estimate.

13. The receiver of claim 11, further comprising an accumulator configured to combine the corrected first and second part values to recover the value of the symbol.

14. The receiver of claim 11 wherein each of the first part and the second part comprise an equal number of bits of the multi-bit symbol estimate.

15. The receiver of claim 11 wherein the first part comprises one or more most significant bits (MSBs) of the multi-bit symbol estimate, and wherein the second part comprises either one of:
one or more least significant bits (LSBs) of the multi-bit symbol estimate; and
one or more middle bits (MBs) of the multi-bit symbol estimate.

16. The receiver of claim 11 wherein the first part comprises one or more middle bits (MBs) of the multi-bit symbol estimate, and wherein the second part comprises one or more least significant bits (LSBs) of the multi-bit symbol estimate.

17. A receiver for recovering a value of a symbol transmitted through an optical communications system from a transmitter, the receiver comprising:
a first detector configured to detect a most likely value of a first part of a multi-bit symbol estimate;
a Forward Error Correction (FEC) decoder configured to process the detected most likely value of the first part to generate a corrected first part value;
a second detector configured to detect a most likely value of a second part of the multi-bit symbol estimate using the corrected first part value; and
the FEC decoder being further configured to process the most likely value of the second part to generate a corrected second part value;
wherein each of the first part and the second part comprise a respective different number of bits of the multi-bit symbol estimate; and
wherein the second detector is further configured to determine the number of bits encoded in the second part, based on the corrected value of the first part.

18. A receiver for recovering a value of a symbol transmitted through an optical communications system from a transmitter, the receiver comprising:
a first detector configured to detect a most likely value of a first part of a multi-bit symbol estimate;

a Forward Error Correction (FEC) decoder configured to process the detected most likely value of the first part to generate a corrected first part value;

a second detector configured to detect a most likely value of a second part of the multi-bit symbol estimate using the corrected first part value; and the FEC decoder being further configured to process the most likely value of the second part to generate a corrected second part value;

wherein the symbol is distributed across two or more dimensions of an optical carrier light.

* * * * *